(12) United States Patent
Yoon et al.

(10) Patent No.: US 9,093,663 B2
(45) Date of Patent: Jul. 28, 2015

(54) ORGANIC LIGHT-EMITTING DISPLAY AND METHODS OF MANUFACTURING THE SAME

(71) Applicant: Samsung Display Co., Ltd., Yongin, Gyeonggi-Do (KR)

(72) Inventors: Ji-Hwan Yoon, Yongin (KR); Chang-Ho Lee, Yongin (KR); Sang-Woo Pyo, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/221,898

(22) Filed: Mar. 21, 2014

(65) Prior Publication Data

US 2015/0115230 A1    Apr. 30, 2015

(30) Foreign Application Priority Data

Oct. 29, 2013  (KR) .................. 10-2013-0129561

(51) Int. Cl.
  *H01J 1/62*    (2006.01)
  *H01L 51/52*   (2006.01)
  *H01L 51/56*   (2006.01)
  *H01L 27/32*   (2006.01)

(52) U.S. Cl.
  CPC ........ *H01L 51/5246* (2013.01); *H01L 27/3244* (2013.01); *H01L 51/5259* (2013.01); *H01L 51/56* (2013.01)

(58) Field of Classification Search
  CPC ............ H01L 2924/00; H01L 51/5237; H01L 51/5246
  USPC .................................................. 313/512, 504
  See application file for complete search history.

(56) References Cited

U.S. PATENT DOCUMENTS

| | | | |
|---|---|---|---|
| 8,242,688 B2 * | 8/2012 | Kwon et al. | 313/504 |
| 2010/0090596 A1 * | 4/2010 | Ota | 313/512 |
| 2011/0309739 A1 | 12/2011 | Song et al. | |
| 2012/0097934 A1 | 4/2012 | Sung et al. | |

FOREIGN PATENT DOCUMENTS

| | | |
|---|---|---|
| KR | 10-2005-0027464 A | 3/2005 |
| KR | 10-2011-0137087 A | 12/2011 |
| KR | 10-2012-0042434 A | 5/2012 |
| KR | 10-2012-0042435 A | 5/2012 |

* cited by examiner

*Primary Examiner* — Vip Patel
(74) *Attorney, Agent, or Firm* — Knobbe Martens Olson & Bear LLP

(57) ABSTRACT

An organic light-emitting display including a conductive-organic small molecular filling material and methods of manufacturing the same are disclosed. The organic light-emitting display includes a substrate, a display unit disposed on the substrate, a sealing substrate disposed above the display unit, a sealing member that attaches the substrate to the sealing substrate and disposed outside the display unit; and a filling material filling a space between the substrate and the sealing substrate inwards from the sealing member, wherein the filling material is a conductive-organic small molecule.

20 Claims, 3 Drawing Sheets

ORGANIC LIGHT-EMITTING DISPLAY AND METHODS OF MANUFACTURING THE SAME

CROSS-REFERENCE TO RELATED APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0129561, filed on Oct. 29, 2013, the disclosures of which are incorporated herein by reference in their entirety.

BACKGROUND

1. Field

The present disclosure relate to an organic light-emitting display and methods of manufacturing the same. More specifically, it relates to an organic light-emitting display including a conductive-organic small molecular filling material and methods of manufacturing the same.

2. Description of the Related Technology

Conventional displays are being replaced by thin-film portable flat displays. From among flat display, electroluminescent light-emitting displays are self-emission displays with wide viewing angles, high contrast ratios, and short response speeds. Due to such advantages, electroluminescent light-emitting displays are becoming the next-generation displays. Organic light-emitting displays including an emission layer formed of an organic material have high brightness, low driving voltage, and short response speeds when compared with inorganic light-emitting displays, and they also produce full-color images.

An organic light-emitting display includes a substrate with a display unit and a sealing substrate disposed above the display unit, wherein the sealing substrate is attached to the substrate by using a sealing member. However, in response to the high demand for large-sized organic light-emitting displays, the size and weight of the sealing substrate increases, and accordingly, a filling material is further disposed between the substrate and the sealing substrate to retain reliability of the organic light-emitting displays.

SUMMARY OF CERTAIN INVENTIVE ASPECTS

One aspect of the disclosed technology relates to an organic light-emitting display including a conductive-organic small molecular filling material and a method of manufacturing the same.

Additional aspects will be set forth in part in the description which follows and, in part, will be apparent from the description, or may be learned by practice of the presented embodiments.

In some embodiments, an organic light-emitting display includes: a substrate; a display unit disposed on the substrate; a sealing substrate disposed above the display unit; a sealing member that attaches the substrate to the sealing substrate and disposed outside the display unit; and a filling material filling a space between the substrate and the sealing substrate inwards from the sealing member, wherein the filling material is a conductive-organic small molecule.

In some embodiments, the conductive-organic small molecule may include an electron withdrawing group selected from a cyano group, a nitro group, a hydroxyl group, —F, —Cl, —Br, and —I.

In some embodiments, the conductive-organic small molecule may include an electron withdrawing group selected from a cyano group and —F.

In some embodiments, the lateral current leakage of the conductive-organic small molecule may be in a range of about 0.1 to about 5.0 mA/cm$^2$.

In some embodiments, the conductive-organic small molecule may be selected from dipyrazino[2,3-f:2',3'-h]quinoxaline-2,3,6,7,10,11-hexacarbonitrile and 2,3,5,6-tetrafluoro-7,7,8,8-tetracyanoquinodimethane.

In some embodiments, the display unit may include a first electrode disposed on the substrate, a second electrode disposed on the first electrode, and an organic layer disposed between the first electrode and the second electrode, wherein a thickness of the second electrode is in the range of about 1 nm to about 100 nm.

In some embodiments, the filling material may contact the second electrode.

In some embodiments, the thickness of the filling material disposed between the sealing substrate and the display unit may be in the range of about 100 nm to about 2000 nm.

In some embodiments, the organic light-emitting display may further include a water-absorbing agent disposed inwards from the sealing member.

In some embodiments, the filling material may cover the display unit.

One more aspect of the disclosed technology relates to a method of manufacturing an organic light-emitting display, the method includes: forming a display unit on a surface of a substrate; forming a sealing member on the surface of the substrate; filling a space defined by the substrate, the display unit, and the sealing member with a filling material; and attaching the substrate to the sealing substrate by using the sealing member, wherein the filling material is a conductive-organic small molecule.

In some embodiments, for the method described herein, the conductive-organic small molecule comprises an electron withdrawing group selected from a cyano group, a nitro group, a hydroxyl group, —F, —Cl, —Br, and —I.

In some embodiments, for the method described herein, the conductive-organic small molecule comprises an electron withdrawing group selected from a cyano group and —F.

In some embodiments, for the method described herein, a lateral current leakage of the conductive-organic small molecule is in the range of about 0.1 to about 5.0 mA/cm$^2$.

In some embodiments, for the method described herein, the conductive-organic small molecule is selected from dipyrazino[2,3-f:2',3'-h]quinoxaline-2,3,6,7,10,11-hexacarbonitrile and 2,3,5,6-tetrafluoro-7,7,8,8-tetracyanoquinodimethane.

In some embodiments, for the method described herein, the display unit comprises a first electrode disposed on the substrate, a second electrode disposed on the first electrode, and an organic layer disposed between the first electrode and the second electrode, wherein the thickness of the second electrode is in a range of about 1 nm to about 150 nm.

In some embodiments, for the method described herein, the filling material contacts the second electrode.

In some embodiments, for the method described herein, the thickness of the filling material disposed between the sealing substrate and the display unit is in the range of about 100 nm to about 2000 nm.

In some embodiments, for the method described herein, the thickness of the filling material disposed between the sealing substrate and the display unit is in the range of about 300 nm to about 800 nm.

DETAILED DESCRIPTION OF CERTAIN INVENTIVE EMBODIMENTS

Figure 1:
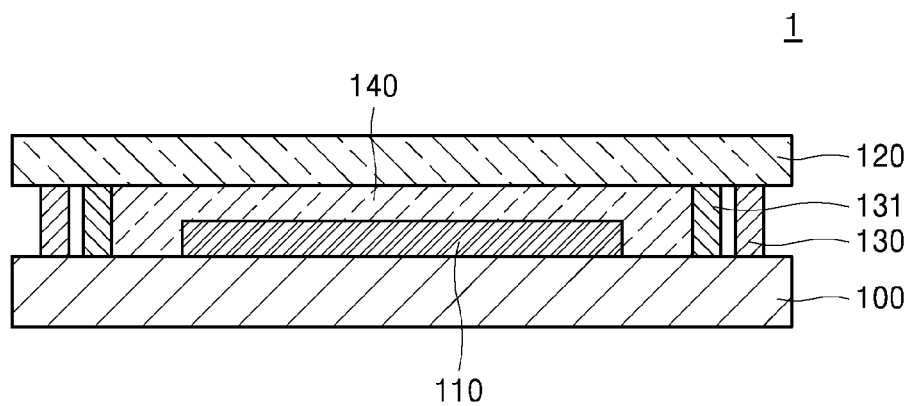
FIG. 1 is a schematic cross-sectional view of an organic light-emitting display.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

Embodiments of the present invention may be variously changed, and some embodiments are illustrated in drawings, and described in detail in the detailed description section of the present application. However, the present invention is not limited to the embodiments, and may be understood as including all changed, equivalent, or alternative forms of the embodiments that are included in the scope of the present invention. In explaining the present invention, when it is regarded that details of the related art may distract the major point of the present invention, the details will not be presented herein.

It will be understood that although the terms "first", "second", etc. may be used herein to describe various components, these components should not be limited by these terms. These components are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

Hereinafter, embodiments of the present invention are described in detail by referring to the attached drawings, and in the drawings, like reference numerals denote like elements, and a redundant explanation thereof will not be provided herein. In the drawings, thicknesses of layers and sizes of regions are exaggerated for clarity. In the drawings, thicknesses of layers and sizes of regions are exaggerated for convenience of explanation.

Figure 2:
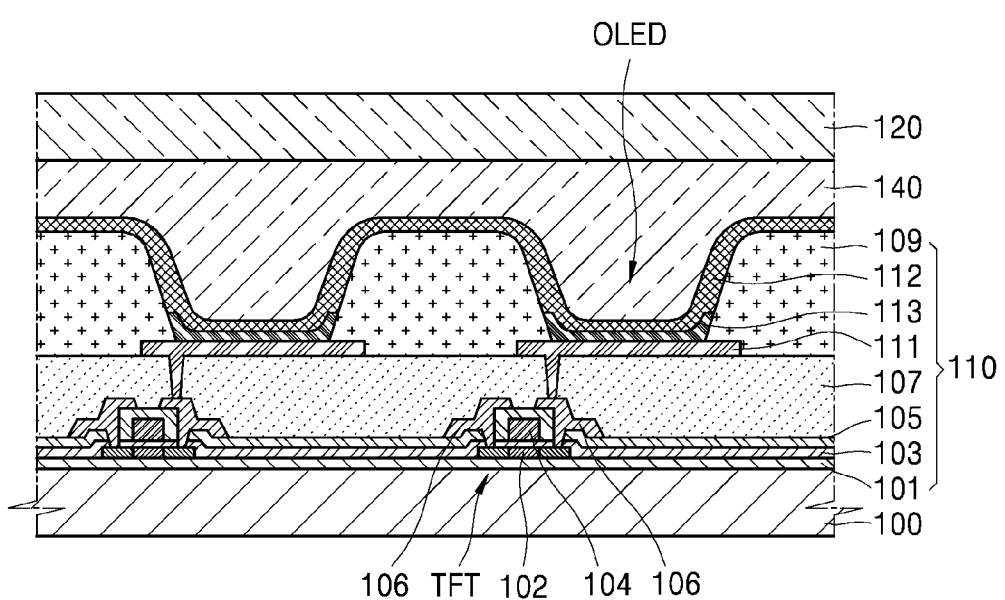
FIG. 2 is a schematic cross-sectional view of a portion of the organic light-emitting display of FIG. 1.

FIG. 1 is a schematic cross-sectional view of an organic light-emitting display 1. FIG. 2 is a schematic cross-sectional view of a portion of the organic light-emitting display 1 of FIG. 1.

Referring to FIGS. 1 and 2, the organic light-emitting display 1 includes a substrate 100, a display unit 110 disposed on the substrate 100, a sealing substrate 120 disposed above the display unit 110, a sealing member 130 for attaching the sealing substrate 120 to the substrate 100, and a filling material 140 filling the space between the substrate 100 and the sealing substrate 120.

The substrate 100 may be any one of various substrates that are used in an organic light-emitting display in the related art, and may be a glass or transparent plastic substrate that has high mechanical strength, thermal stability, transparency, surface smoothness, ease of handling, and water repellency.

A plastic material suitable for use in the substrate 100 may include an insulating organic material, and may be an organic material selected from polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose tri acetate (TAC), and cellulose acetate propionate (CAP).

In the case of a bottom emission type organic light-emitting display in which an image is embodied toward the substrate 100, a material for the substrate 100 may be a transparent material. However, in the case of a top emission type organic light-emitting display in which an image is embodied in a direction away from the substrate 100, the material for the substrate 100 may not be limited to a transparent material. In this case, metal may be used to form the substrate 100. When the substrate 100 is formed of metal, the substrate 100 may include at least one selected from carbon, iron, chromium, manganese, nickel, titanium, molybdenum, stainless steel (SUS), Invar alloy, an inconel alloy, and a kovar alloy. Instead, however, the substrate 100 may be formed of metal foil.

In some embodiments, the buffer layer 101 may be formed on the substrate 100 to flatten a top surface of the substrate 100 and to prevent permeation of impurity elements thereinto. The buffer layer 101 may be formed by various deposition methods using $SiO_2$ and/or $SiN_x$, and examples of various deposition methods are plasma enhanced chemical vapor deposition (PECVD), atmospheric pressure CVD (APCVD), and low pressure CVD (LPCVD). In another embodiment, the buffer layer 101 may not be formed.

An array of thin film transistors TFTs may be formed on the top surface of the substrate 100. FIG. 2 illustrates only one thin film transistor TFT in each pixel. However, this structure is provided for illustrative purpose only, and the embodiment of the present disclosure is not limited to a pixel including one thin film transistor TFT. For example, in other embodiments, each pixel may include a plurality of thin film transistors TFTs and a storage capacitor.

Thin film transistors TFTs may be electrically connected to an organic light-emitting device OLED to drive the organic light-emitting device OLED. The thin film transistor TFT illustrated in FIG. 2 is a top gate-type thin film transistor, and sequentially includes an active layer 102, a gate electrode 104, and a source drain electrode 106. Although the thin film transistor according to the present embodiment is a top gate-type thin film transistor, the embodiment of the present invention is not limited to the top gate-type thin film transistor. That is, various other-types thin film transistor TFT may instead be used, which is obvious to one of ordinary skilled in the art In some embodiments, the active layer 102 may be formed by depositing an inorganic semiconductor, such as silicon or an oxide semiconductor, or an organic semiconductor on the entire surface of the substrate 100 with the buffer layer 101 formed thereon, followed by patterning. When the active layer 102 is formed by using silicon, an amorphous silicon layer is formed on the entire surface of the substrate 100, and then, the amorphous silicon layer is crystallized to form a polycrystalline silicon layer an then, the polycrystalline silicon layer is patterned. Then, edge portions of the active layer 102 are doped with impurities to form a source region, a drain region, and a channel region disposed between the source region and the drain region.

In some embodiments, the gate insulating film 103 formed of, for example, $SiO_2$ or $SiN_x$, is formed on the active layer 102, and the gate electrode 104 is formed on a portion of the gate insulating film 103. The gate electrode 104 is connected to a gate line (not shown) through which on/off signals for the thin film transistor TFT are applied.

An interlayer insulating film 105 is formed on the gate electrode 104, and through contact holes, source and drain electrodes 106 respectively contact the source and drain regions of the active layer 102. The thin film transistor TFT is covered by the passivation film 107 so that the thin film transistor TFT is protected from the outside.

The passivation film 107 may include at least one selected from an inorganic insulating film and an organic insulating film. In some embodiments, the inorganic insulating film may include $SiO_2$, SiNx, SiON, $Al_2O_3$, $TiO_2$, $Ta_2O_5$, $HfO_2$, $ZrO_2$, BST, or PZT, and the organic insulating film may include commercially available polymer PMMA, PS, a phenol-based group containing polymer derivative, an acryl-based polymer, an imide-based polymer, an arylether-based polymer, an amide-based polymer, a sulfur-based polymer, p-xylene based polymer, a vinylalcohol-based polymer, or a blend thereof. Also, the passivation film 107 may be formed as a composite stack of the inorganic insulating film and the organic insulating film.

An organic light-emitting device OLED is disposed on an emission region of the passivation film 107. The emission region and a non-emission region will be described later in connection with the pixel define layer 109.

The organic light-emitting device OLED includes a pixel electrode 111 formed on the passivation film 107, an opposite electrode 112 facing the pixel electrode 111, and an intermediate layer 113 disposed between the pixel electrode 111 and the opposite electrode 112. A display may be categorized, according to an emission direction, as a bottom emission-type display, a top emission-type display, and a dual emission-type display. In the bottom emission-type display, the pixel electrode 111 may be a light-transmissive electrode and the opposite electrode 112 may be a reflective electrode. In the top emission-type display, the pixel electrode 111 may be a reflective electrode and the opposite electrode 112 may be a semi-transmissive electrode. Although the present disclosure is explained based on a bottom emission-type display, the embodiment of the present invention is not limited thereto.

The pixel electrode 111 may be formed as a transparent film formed of a high work-function material, such as ITO, IZO, ZnO, or $In_2O_3$. The pixel electrode 111 may be patterned into islands respectively corresponding to pixels. Also, the pixel electrode 111 is connected to an external terminal (not shown) to act as an anode.

A pixel define layer 109 having a predetermined thickness may be formed to cover the pixel electrode 111 by using an insulating material. The pixel define layer 109 may be formed by, for example, spin coating at least one organic insulating material, such as polyimide, polyamide, acryl resin, benzocyclobutene, or a phenol resin. An opening is formed in the pixel define layer 109 to expose a central portion of the pixel electrode 111, and in the region defined by the opening, an organic emission layer for light-emission is formed, and thus, the emission region is defined. Also, when the emission region is defined on the pixel define layer 109 due to the opening, a portion protruding from the emission region is naturally formed between emission regions. The protruding portion is defined as a non-emission region because an organic emission layer is not formed thereon.

The opposite electrode 112 may be formed of a low work-function material, such as Li, Ca, LiF/Ca, LiF/Al, Al, Mg, or Ag. The opposite electrode 112 may be formed as a common electrode on the entire surface of the substrate 100. The opposite electrode 112 may be connected to an external terminal (not shown) to act as a cathode.

In some embodiments, the pixel electrode 111 may act as a cathode and the opposite electrode 112 may act as an anode.

The thickness of the opposite electrode 112 may be in a range of about 1 to about 150 nm. For example, the thickness of the opposite electrode 112 may be in a range of about 1 to about 100 nm, but is not limited thereto. However, in the case of the organic light-emitting display 1, even when the opposite electrode 112 has a relatively small thickness, the same or smaller panel driving voltage may be obtained compared to an opposite electrode having a relatively high thickness.

The intermediate layer 113 includes an organic emission layer that emits light, and the organic emission layer may include a low molecular weight organic material or a polymer organic material. When the organic emission layer is a low molecular organic layer formed of a low molecular weight organic material, in a direction from the organic emission layer to the pixel electrode 111, a hole transport layer (HTL) and a hole injection layer (HIL) may be sequentially stacked, and in a direction from the organic emission layer to the opposite electrode 112, an electron transport layer (ETL) and an electron injection layer (EIL) are sequentially stacked. If needed, in addition to the HTL, the HIL, the ETL, and the EIL, various other layers may be additionally stacked.

In some embodiments, when the organic emission layer is a polymer organic layer formed of a polymer organic material in the direction from the organic emission layer to the pixel electrode 111, only a HTL layer may be stacked. In this regard, the HTL may be formed on the pixel electrode 111 by ink-jet printing or spin coating poly-(2,4)-ethylene-dihydroxy thiophene (PEDOT) or polyaniline (PANI).

The substrate 100 with the display unit 110 disposed thereon is attached to the sealing substrate 120 which is to be disposed above the display unit 110. The sealing substrate 120 may be a glass or transparent plastic substrate that has high mechanical strength, thermal stability, transparency, surface smoothness, ease of handling, and water repellency. A metal substrate may also be used as the sealing substrate 120.

The substrate 100 is coupled to the sealing substrate 120 by using the sealing member 130. The sealing member 130 may be a sealing glass frit. The sealing member 130 protects the display unit 110 from the permeation of the outside water molecules and air.

In some embodiments, the water-absorbing agent 131 may be further disposed on a side of the sealing member 130 toward the display unit 110. The water-absorbing agent 131 may easily react with water molecules and oxygen to prevent a decrease in lifespan of the organic light-emitting device OLED due to water molecules and oxygen. The water-absorbing agent 131 may include alkalimetaloxide, alkali earth-based metaloxide, metalhalogenate, lithium sulfate, metal sulfate, metal perchlorate, silicagel, phosphorus pentoxide, or a mixture thereof. The material for use as the water-absorbing agent 131 and the location of the water-absorbing agent 131 are not limited thereto.

A filling material 140 may be disposed inwards from the sealing member 130, and in detail, the filling material 140 fills the space between the substrate 100 and the sealing substrate 120. Accordingly, the filling material 140 covers the display unit 110, but the location of the filling material 140 is not limited thereto. The filling material 140 may contact the opposite electrode 112, but the location of the filling material 140 is not limited thereto. For example, the filling material 140 disposed between the sealing substrate 120 and the display unit 110 may have a thickness in the range of about 100 nm to about 2000 nm, for example, about 300 nm to about 800 nm. When the thickness of the filling material 140 is within these ranges, dark spots may not be formed and the panel driving voltage may decrease.

The filling material 140 may be a conductive organic small molecule. In this regard, the term "organic small molecule" means any molecule other than a polymer. The conductive-organic small molecule has high conductivity, and accordingly, even when the opposite electrode 112 has a small thickness, the display unit 110 may not undergo a voltage drop.

The conductive-organic small molecular may include an electron withdrawing group. The term "electron withdrawing group" refers to a substituent that relatively strongly withdraws an electron pair included in a covalent bond, and examples thereof are a cyano group, a nitro group, a hydroxyl group, and a halogen atom. The halogen atom may be, for example, —F, —Cl, —Br, or —I. For example, the conductive-organic small molecule may include an electron withdrawing group selected from a cyano group and —F, but is not limited thereto.

The three-dimensional molecular structure of the conductive-organic small molecule is nearly a plane, and accordingly, when the conductive-organic small molecule is formed as a thin film, conductive-organic small molecules may be easily stacked on each other.

The lateral current leakage of the conductive-organic small molecule may be in the range of about 0.1 to about 5.0 mA/cm$^2$. For example, the lateral current leakage of the conductive-organic small molecule may be in the range of about 0.15 to about 3.0 mA/cm$^2$. When the lateral current leakage is outside these ranges, even when the opposite electrode 112 is formed to have a small thickness, the display unit 110 may not undergo a voltage drop.

The lateral current leakage is determined by measuring a current density in a direction (direction A in FIG. 7) perpendicular to a direction in which a voltage is applied to an organic film formed of a conductive-organic small molecule.

Figure 7:
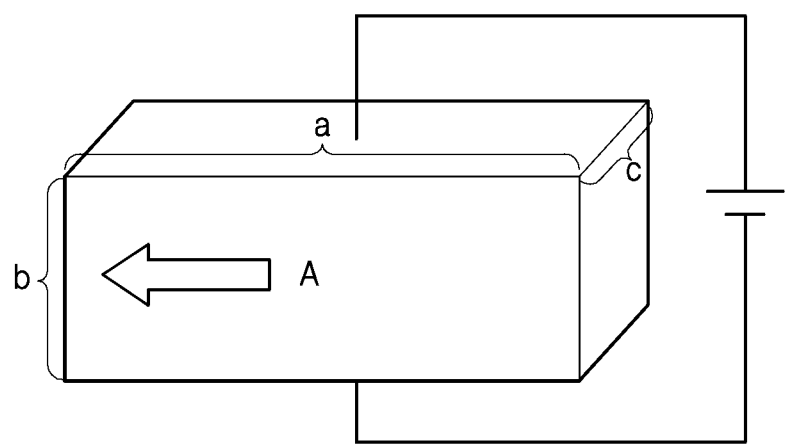
FIG. 7 is a schematic view to illustrate how to measure a lateral current leakage.

Hereinafter, in connection with FIG. 7, a method of determining the lateral current leakage will be described. A voltage is applied to an organic film having a length of 15 μm (a), a thickness of 1 μm (b), and a width of 10 μm (c), which is formed of a material of which lateral current leakage is to be measured, in a direction parallel to the thickness (b). In this regard, the voltage is 4.0 V, and a density of current flowing in a direction parallel to the length perpendicular to the voltage appliance direction is measured to determine the lateral current leakage.

For example, the lateral current leakage of N N,N'-bis (naphthalene-1-yl)-N,N'-bi(phenyl)-benzidine (NPB) is 0.01 mA/cm$^2$, and the lateral current leakage of dipyrazino[2,3-f: 2',3'-h]quinoxaline-2,3,6,7,10,11-hexacarbonyl (HAT-CN) is 0.77 mA/cm$^2$.

The conductive-organic small molecule may be selected from dipyrazino[2,3-f:2',3'-h]quinoxaline-2,3,6,7,10,11-hexacarbonitrile and 2,3,5,6-tetrafluoro-7,7,8,8-tetracyano-quinodimethane.

FIGS. 3 to 6 are schematic cross-sectional views to explain a method of manufacturing the organic light-emitting display of FIG. 1.

Referring to FIGS. 3 to 6, a method of manufacturing an organic light-emitting display includes: forming a display unit on the surface of a substrate; forming a sealing member on the surface of the substrate; filling a space defined by the substrate, the display unit, and the sealing member with a filling material; and attaching the sealing substrate to the substrate by using the sealing member.

Figure 3:
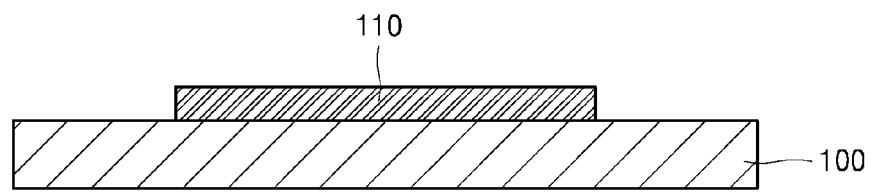
FIGS. 3 to 6 are schematic cross-sectional views to illustrate an example of the method of manufacturing the organic light-emitting display of FIG. 1.

First, as illustrated in FIG. 3, the display unit 110 is formed on the surface of the substrate 100. The display unit 110 is the same as described in connection with FIGS. 1 and 2, and may be selected from various known organic emission displays, and accordingly, a method of manufacturing the display unit 110 will not be described herein.

Figure 4:
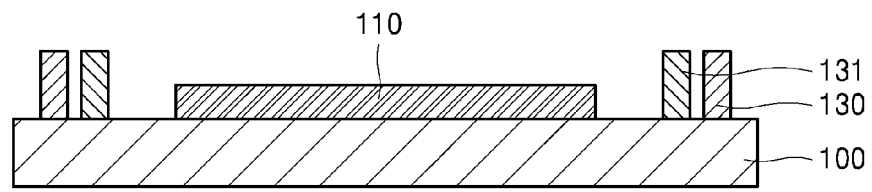

Then, as illustrated in FIG. 4, the sealing member 130 is formed on the surface of the substrate 100. The sealing member 130 may be formed by coating a liquid or paste sealing member. Although in FIG. 4 the sealing member 130 is formed on the surface of the substrate 100, the present disclosure is not limited thereto, and the sealing member 130 may also be disposed on a surface of the sealing substrate 120.

Figure 5:
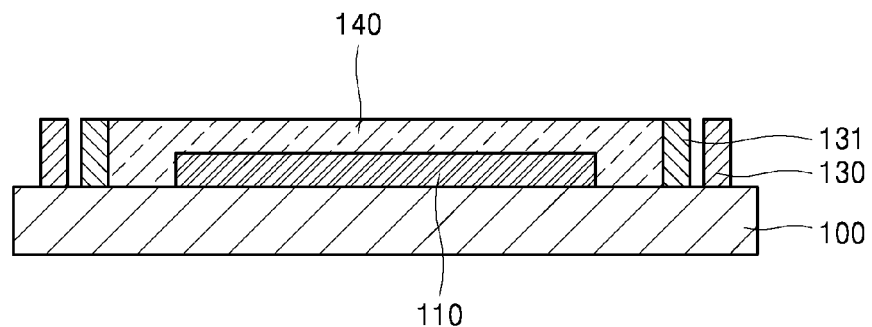

Then, as illustrated in FIG. 5, the portion inwards from the sealing member 130 is filled with the filling material 140. The filling material 140 may be a conductive-organic small molecule. The filling with the filling material 140 may be performed by using any one of various known methods.

In the method described above, the sealing member 130 is formed and then the filling material 140 is disposed. However, the present disclosure is not limited to this sequence. For example, during dispensing, the filling material 140 may irregularly leak out due to pressure. Accordingly, to prevent the leakage, the sealing member 130 is formed, and then, the filling material 140 may be dispensed.

Also, the water-absorbing agent 131 may be further formed inwards from the sealing member 130. The water-absorbing agent 131 may be disposed in a liquid state by coating.

Figure 6:
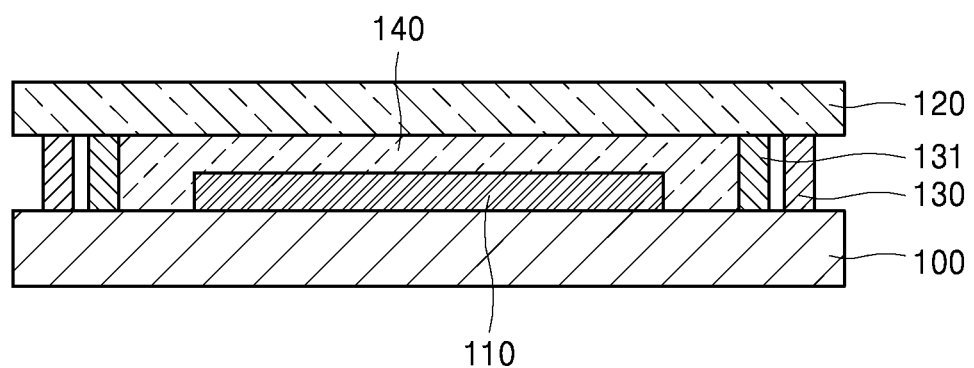

Then, as illustrated in FIG. 6, the substrate 100 is attached to the sealing substrate 120 by using the sealing member 130.

In detail, the substrate 100 is disposed to face the sealing substrate 120, and in a vacuum condition, ultraviolet rays are irradiated to a portion of the substrate 100 corresponding to the sealing member 130 and a portion of the sealing substrate 120 corresponding to the sealing member 130 to couple the substrate 100 with the sealing substrate 120. When the coupling is performed in a vacuum condition, the permeation of outside water molecules and foreign materials may be prevented. When ultraviolet rays are irradiated to the substrate 100 and the sealing substrate 200, a portion of the sealing member 130 contacting the substrate 100 and the sealing substrate 120 may melt to attach the substrate 100 to the sealing substrate 120. However, this coupling method is illustrative only, and the substrate 100 and the sealing substrate 120 may be attached to each other by using various other methods selected according to a sealing member.

Hereinafter, embodiments of the present invention will be described in detail. However, the embodiments are provided herein for illustrative purpose only, and do not limit the scope of the present invention.

Comparative Example 1

Manufacturing of Organic Light-Emitting Display Including Curable Filling Material Preparation of Curable Filling Material A composition including 60 mol % butyl acrylate, which was an adhesive monomer, 20 mol % styrene, which was an aggregating monomer, and 20 mol % ethylene glycol methacrylate, which was a cross-linking monomer, was combined in the suspension to undergo polymerization with an initiator to prepare an acryl resin. The initiator used in this experiment was benzoyl peroxide.

Manufacturing of Organic Light-Emitting Display Apparatus

An acryl resin was slit-coated to a thickness of 500 nm on a cathode having a thickness of 300 nm.

Comparative Example 2

Manufacturing of Organic Light-Emitting Display Including NPB Filling Material

NPB was deposited to a thickness of 500 nm on a cathode having a thickness of 300 nm.

Example

Manufacturing of Organic Light-Emitting Display Including HAT-CN Filling Material HAT-CN was deposited to a thickness of 500 nm on a cathode having a thickness of 100 nm.

Evaluation Example 1

Dark Spots

In the case of the organic light-emitting display manufactured according to Comparative Example 1, each display had at least 100 dark spots, and in the case of the organic light-emitting display of Example, each display had at most 10 dark spots. These dark spots were identified by the naked eyes.

In general, it is known that dark spots occur when a circuit of a substrate is damaged by foreign materials, and pixel shrinkage occurs due to outgas of a filling material.

That is, a curable filling material of the related art includes an organic material, such as a highly-reactive binder. Accordingly, when the filling material is hardened by heating, outgas is generated due to heat occurring in a display unit, and thus, pixel shrinkage occurs.

However, the filling material described herein does not include a highly-reactive organic material. Accordingly, the filling material has high thermal stability, and outgas generated therefrom may be minimized to prevent the occurrence of pixel shrinkage.

Evaluation Example 2

Display Driving Voltage

The driving voltage for the production of 100 nit of brightness applied between an anode and a cathode of an organic light-emitting display was measured, and results thereof are shown in Table 1 below:

TABLE 1

|  | Example | Comparative Example 2 |
|---|---|---|
| Cathode thickness | 100 | 300 |
| Driving Voltage (V) | 15.2 | 16.0 |

Referring to Table 1, even with a smaller cathode thickness, the organic light-emitting display of Example had an equivalent or smaller driving voltage than the organic light-emitting display of Comparative Example 2.

The organic light-emitting display described herein and a method of manufacturing the same may reduce the formation of dark spots and prevent pixel shrinkage.

Also, even when the cathode of the display unit is thin, resistance of the cathode may be effectively reduced to decrease a driving voltage of an organic light-emitting display.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting display comprising:
    a substrate;
    a display unit disposed on the substrate;
    a sealing substrate disposed above the display unit;
    a sealing member that attaches the substrate to the sealing substrate and disposed outside the display unit; and
    a filling material filling a space between the substrate and the sealing substrate inwards from the sealing member,
    wherein the filling material is a conductive-organic small molecule.

2. The organic light-emitting display of claim 1, wherein the conductive-organic small molecule comprises an electron withdrawing group selected from a cyano group, a nitro group, a hydroxyl group, —F, —Cl, —Br, and —I.

3. The organic light-emitting display of claim 1, wherein the conductive-organic small molecule comprises an electron withdrawing group selected from a cyano group and —F.

4. The organic light-emitting display of claim 1, wherein a lateral current leakage of the conductive-organic small molecule is in the range of about 0.1 to about 5.0 mA/cm$^2$.

5. The organic light-emitting display of claim 1, wherein the conductive-organic small molecule is selected from dipyrazino[2,3-f:2',3'-h]quinoxaline-2,3,6,7,10,11-hexacarbonitrile and 2,3,5,6-tetrafluoro-7,7,8,8-tetracyanoquinodimethane.

6. The organic light-emitting display of claim 1, wherein the display unit comprises a first electrode disposed on the substrate, a second electrode disposed on the first electrode, and an organic layer disposed between the first electrode and the second electrode,
    wherein the thickness of the second electrode is in the range of about 1 nm to about 150 nm.

7. The organic light-emitting display of claim 6, wherein the filling material contacts the second electrode.

8. The organic light-emitting display of claim 1, wherein the thickness of the filling material disposed between the sealing substrate and the display unit is in a range of about 100 nm to about 2000 nm.

9. The organic light-emitting display of claim 1, wherein the thickness of the filling material disposed between the sealing substrate and the display unit is in a range of about 300 nm to about 800 nm.

10. The organic light-emitting display of claim 1, further comprising a water-absorbing agent disposed inwards from the sealing member.

11. The organic light-emitting display of claim 1, wherein the filling material covers the display unit.

12. A method of manufacturing an organic light-emitting display, the method comprising:

forming a display unit on a surface of a substrate;
forming a sealing member on the surface of the substrate;
filling a space defined by the substrate, the display unit, and the sealing member with a filling material; and
attaching the substrate to the sealing substrate by using the sealing member;
wherein the filling material is a conductive-organic small molecule.

13. The method of claim 12, wherein the conductive-organic small molecule comprises an electron withdrawing group selected from a cyano group, a nitro group, a hydroxyl group, —F, —Cl, —Br, and —I.

14. The method of claim 12, wherein the conductive-organic small molecule comprises an electron withdrawing group selected from a cyano group and —F.

15. The method of claim 12, wherein a lateral current leakage of the conductive-organic small molecule is in the range of about 0.1 to about 5.0 mA/cm$^2$.

16. The method of claim 12, wherein the conductive-organic small molecule is selected from dipyrazino[2,3-f:2',3'-h]quinoxaline-2,3,6,7,10,11-hexacarbonitrile and 2,3,5,6-tetrafluoro-7,7,8,8-tetracyanoquinodimethane.

17. The method of claim 12, wherein
the display unit comprises a first electrode disposed on the substrate, a second electrode disposed on the first electrode, and an organic layer disposed between the first electrode and the second electrode,
wherein the thickness of the second electrode is in a range of about 1 nm to about 150 nm.

18. The method of claim 17, wherein the filling material contacts the second electrode.

19. The method of claim 12, wherein the thickness of the filling material disposed between the sealing substrate and the display unit is in the range of about 100 nm to about 2000 nm.

20. The method of claim 12, wherein the thickness of the filling material disposed between the sealing substrate and the display unit is in the range of about 300 nm to about 800 nm.

* * * * *